United States Patent
Choi (10) Patent No.: US 10,429,419 B2
(45) Date of Patent: Oct. 1, 2019

(54) SYSTEM AND METHOD FOR ITERATIVE CONDITION MONITORING AND FAULT DIAGNOSIS OF ELECTRIC MACHINES

(71) Applicant: Seungdeog Choi, Fairlawn, OH (US)

(72) Inventor: Seungdeog Choi, Fairlawn, OH (US)

(73) Assignee: The University of Akron, Akron, OH (US)

( * ) Notice: Subject to any disclaimer, the term of this patent is extended or adjusted under 35 U.S.C. 154(b) by 205 days.

(21) Appl. No.: 14/874,210

(22) Filed: Oct. 2, 2015

(65) Prior Publication Data
US 2016/0282416 A1    Sep. 29, 2016

Related U.S. Application Data (60) Provisional application No. 62/138,489, filed on Mar. 26, 2015.

(51) Int. Cl.
*G01R 23/20*    (2006.01)
*G01R 31/34*    (2006.01)

(52) U.S. Cl.
CPC ........... *G01R 23/20* (2013.01); *G01R 31/343* (2013.01)

(58) Field of Classification Search
None
See application file for complete search history.

(56) References Cited

U.S. PATENT DOCUMENTS

| | | | | |
|---|---|---|---|---|
| 4,965,513 A * | 10/1990 | Haynes | .................. | G01R 31/34 318/490 |
| 5,049,815 A * | 9/1991 | Kliman | ................ | G01R 31/343 324/545 |
| 6,291,987 B1 * | 9/2001 | Dean | ..................... | H02M 7/521 324/164 |
| 8,405,339 B2 * | 3/2013 | Zhang | ................... | G01R 31/343 318/490 |
| 2002/0149342 A1 * | 10/2002 | Nakata | ....................... | H02P 6/06 318/801 |
| 2013/0049733 A1 * | 2/2013 | Neti | ....................... | G01R 31/343 324/71.1 |
| 2015/0260794 A1 * | 9/2015 | Athikessavan | ....... | G01R 31/343 702/58 |
| 2017/0087990 A1 * | 3/2017 | Neti | ...................... | B60L 3/0061 |

OTHER PUBLICATIONS

Choi et al. "Iterative Condition Monitoring and Fault Diagnosis Scheme of Electric Motor for Harsh Industrial Application" IEEE Transactions on Industrial Electronics, vol. 62, No. 3 (Date of publication Oct. 3, 2014) pp. 1760-1769.*

* cited by examiner

*Primary Examiner* — J. H. Hur
(74) *Attorney, Agent, or Firm* — Renner Kenner Greive Bobak Taylor and Weber; Ray Weber; Tim Hodgkiss (57) ABSTRACT

A system and method for iterative condition monitoring and fault diagnosis of an electric machine, such as an electric motor, is configured to iteratively analyze a pattern of multiple fault signatures in a motor current signal under harsh, noisy conditions. As such, the present invention evaluates patterns of multiple fault signatures that are spread over the wide motor current spectrum, by effectively rejecting signal distortions, harsh noise, and interference from the dynamic operation of the electric machine.

3 Claims, 11 Drawing Sheets

Table. 1. *Threshold (n)* (Th.n) and false detection probability at *n* iteration (FD_n) (Assumed 50K samples).

| N1, N2, Det_mat_1 size, Det_mat_2 size, SNR | Th. 0 | Th. 1 | Th. 2 | FD_0 | FD_1 | FD_2 |
|---|---|---|---|---|---|---|
| 2, 05, 30, 30, -65 | 0.50 | 0.50 | 0.50 | 0.39 | 0.14 | 0.01 |
| 2, 03, 10, 10, -35 | 0.67 | 0.6 | 0.50 | 0.11 | 0.1 | 0.01 |

| Table. 2. System Environment. | |
|---|---|
| Parameter | Value |
| ADC | 12 bit and 25Khz sampling frequency |
| Data acquisition board | NI-DAQmx |
| Motor | 3 hp IM |
| # of pole | 4 |
| DSP board | eZ DSP 320F2812 |
| Control | V/f |
| Full load speed | 1760 |
| Input voltage | 230V |

Table. 4. *Det_mat_2.*

| | Torque | Detection % |
|---|---|---|
| A | 10% | 100% |
| | 30% | 100% |
| | 50% | 66% |
| B | 10% | 16% |
| | 30% | 0% |
| | 50% | 0% |

Fig. 13

Table. 5. Decision result.

| | Torque | Detection % |
|---|---|---|
| A | 10% | 100% |
| | 30% | 100% |
| | 50% | 100% |
| B | 10% | 0% |
| | 30% | 0% |
| | 50% | 0% |

(A) is the decisions with eccentricity signals and noise signals, and (B) is the false decision with only noise signals.

Fig. 14

Table. 6. *Det_mat_2.*

| | Torque | Detection % |
|---|---|---|
| A | 10% | 100% |
| | 30% | 100% |
| | 50% | 66% |
| B | 10% | 16% |
| | 30% | 16% |
| | 50% | 33% |

Fig. 15

Table. 7. Decision result.

| | Torque | Detection % |
|---|---|---|
| A | 10% | 100% |
| | 30% | 100% |
| | 50% | 100% |
| B | 10% | 0% |
| | 30% | 0% |
| | 50% | 0% |

Fig. 16

Table. 8. *Det_mat_2.*

| | Torque | Detection % |
|---|---|---|
| A | 10% | 100% |
| | 30% | 100% |
| | 50% | 83% |
| B | 10% | 16% |
| | 30% | 0% |
| | 50% | 16% |

Fig. 17

Table. 9. Decision result.

| | Torque | Detection % |
|---|---|---|
| A | 10% | 100% |
| | 30% | 100% |
| | 50% | 100% |
| B | 10% | 0% |
| | 30% | 0% |
| | 50% | 0% |

Fig. 18

SYSTEM AND METHOD FOR ITERATIVE CONDITION MONITORING AND FAULT DIAGNOSIS OF ELECTRIC MACHINES

CROSS-REFERENCE TO RELATED APPLICATION

This application claims the benefit of U.S. Provisional Application No. 62/138,489 filed on Mar. 26, 2015, the content of which is incorporated herein by reference.

TECHNICAL FIELD

The present invention generally relates to motor current signature analysis (MCSA) processes used to monitor and diagnose faults of an electric motor. Particularly, the present invention relates to a MCSA process for monitoring and diagnosing faults of electric motors operating in harsh industrial environments where the signal-to-noise ratio of a motor current signal is low. More particularly, the present invention relates to a MCSA process that simultaneously utilizes multiple fault signature patterns, noise signal frequency patterns, and fundamental harmonic current frequency patterns of a motor current signal to reliably identify faults of an electric motor operating in harsh, noisy operating environments.

BACKGROUND OF THE INVENTION

Electric motors and electric generators (i.e. electric machines) have been extensively utilized in critical service applications, such as electric vehicles for example. As such, time-demanding electric motor/generator control information and fault symptoms must be precisely monitored and adjusted at the motor to ensure its continued safe and secure operation. One fault diagnosis method that has been investigated to identify the indication of incipient, or initial, failure symptoms of electric machines, so as to prevent their catastrophic failure is referred to as Motor Current Signature Analysis (MCSA).

MCSA utilizes a motor current signal that is applied to the electric machine, which is readily available from a motor control service routine without the need of extra hardware or design cost. The motor current signal provides information regarding a vibration signature with respect to error rate under different operating conditions of the electric machine, such as speed variation and load torque variation. This vibration signature inherently contains valuable information regarding the various health status conditions of the electric machine, and the defined harmonics of the signature are utilized as health status indicators to diagnose various faults in the electric machine.

In traditional MCSA diagnosis, the fault conditions of an induction motor, or other electric machine, are analyzed to identify abnormal harmonic modulation at specific characteristic fault frequencies in a motor current signal spectrum. Fast Fourier Transform (FFT) has been utilized to perform the motor current spectrum analysis by assuming stationary operation of the motor or electric machine. In addition, a Short Time Fourier Transform (STFT) has also been used by assuming short-time steady state operation of the motor, and by sacrificing the resolution of the MCSA analysis. STFT has also been utilized to detect the eccentricity of a motor while an electric vehicle is in an idle mode. In addition, without applying restrictions on the operating point of the electric machine, a high-speed Digital Signal Processor (DSP) and sophisticated signal processing have been utilized to resolve non-linear signal distortion. Alternative time-frequency analysis techniques have also achieved acceptable performance by applying the Zhao-Atlas-Marks distribution in performing the subject analysis. In addition, other time-frequency analysis methods, such as adaptive statistical time-frequency distributions, and Wigner-Ville distributions, have also achieved successful performance; however they require overwhelming complexity and memory occupancy capacity. In a majority of the abovementioned methods, the operating point limitations of the electric motor, and other electrical machines, as well as the large computation complexity requirements of diagnostic signal processing has been problematic.

Advanced signal processing has been widely utilized for noise cancelation and identifying non-linear characteristic fault signatures. In addition, different probabilistic models, high-resolution frequency analysis and time-frequency analysis algorithms have been applied to obtain reliable fault signatures. A statistics-based Welch's periodogram of the stator currents of an electric motor has also been utilized for fault indication. The probability of the occurrence of abnormal conditions and presence of a fault is also confirmed through Bayesian estimation algorithms. Depending on the type of fault, different statistical methods have been employed to process/analyze fault signatures. For example, advanced motor current signal analysis has been utilized to diagnose roller bearing faults based on externally induced vibration and has been used to diagnose demagnetization faults of Permanent Magnet Synchronous Motors (PMSM). Electrical fault detection has also been carried out in three-phase wound-rotor induction machines (WRIM), while open-loop physics-based back electromotive force (EMF) signals have been measured for the diagnosis of inter-turn phase winding faults of PMSMs; and hierarchical neural network structures have been used to carry out statistical time feature analysis of vibration signals from a bearing to diagnose faults.

However the fundamental limitation of the MCSA diagnosis process is its inherent vulnerability to noise and interference, as MCSA relies on an extremely small fault frequency. That is, small frequency tone detection in the whole motor current spectrum is easily distorted by interference from harsh industrial noise in the surrounding environment of the electric machine, as well as the low quality of power applied to operate the motor, and the transient operation of the motor.

One popular approach for robust signal detection, including that used in the information technology industry (IT), is the use of not only one frequency tone, but the use of coded multi-frequency signal patterns. In addition, multi-frequency based signal detection processes have been widely adopted in wireless communication systems to implement a robust signal acquisition process that is capable of effective operation under harsh industrial noise, as well as in the presence of frequency disturbances, and frequency fading, etc. The design of a preamble signal, which is used for critical communication channel estimation and identification has been done through information theory to fully utilize the frequency distribution pattern information. Constant amplitude zero autocorrelation (CAZAC) sequence, Golay sequence, and a pseudo-noise (PN) sequence are examples that use $2^{nd}$, $3^{rd}$, and $4^{th}$ generation wireless communication (code division multiple access (CDMA)) or orthogonal frequency division multiple access (OFDM) system. Signal detection techniques utilizing frequency distribution patterns have allowed robust communication to be possible under harsh industrial noise conditions because a fixed frequency-pattern can be discriminated from random noise patterns with considerably high probability.

Therefore, there is a need for a system and method for iterative condition monitoring and fault diagnosis of an electric machine that evaluates patterns of multiple fault signatures of a motor current signal applied to an electric machine that are spread over the wide motor current spectrum in a harsh industrial environment that is subject to electromagnetic noise, while rejecting signal distortion conditions, harsh noise, and interference from the dynamic operation of the electric motor. Furthermore, in modern energy conversion systems, especially in critical service applications that are subject to harsh industrial applications, the low signal-to-noise ratio (SNR) of the motor current signal makes identifying a reliable fault indication a challenging issue. As such, there is a need for a fault diagnosis signal processing scheme that is able to provide predictable and reliable fault diagnosis performance, while minimizing false alarm, and miss alarm rates. In addition, there is a need for a fault diagnosis scheme that is able to provide continuous monitoring independently from the operating point of an electric machine. Furthermore, there is a need in the art for a fault diagnosis system that simultaneously minimizes the false alarm and miss alarm rate under harsh noise conditions.

SUMMARY OF THE INVENTION

In light of the foregoing, it is a first aspect of the present invention to provide a method of detecting a fault in an AC (alternating current) electric motor, comprising the steps of monitoring, at a computer system, a motor current signal applied to the AC electric motor; obtaining, at the computer system, a motor current spectrum signature; identifying, at the computer system, n fault characteristic frequency signatures from the motor current spectrum signature, wherein n is an integer value; identifying, at the computer system, m random noise frequency signatures from the motor current spectrum signature, wherein m is an integer value equal to n; comparing, at the computer system, an amplitude of the n fault characteristic frequency signature with an amplitude of the m random noise frequency signature; generating, at the computer system, at least one initial detection matrix including at least one matrix element, such that each the matrix element is associated with the comparison of the n fault characteristic frequency signature amplitude and the m random noise frequency signature amplitude; assigning, at the computer system, a binary 1 to the matrix element if the amplitude of the n fault characteristic frequency signature is greater than the amplitude of the m random noise frequency signature to identify the presence of a fault, or assigning a binary 0 to the matrix element if the amplitude of the fault characteristic frequency signature is less than the amplitude of the random noise frequency signature amplitude to identify the presence of a non-fault; generating, at the computer system, a probability distribution based on the at least one initial detection matrix; applying, at the computer system, a predetermined probability decision metric threshold to the probability distribution of the at least one initial detection matrix to generate at least one intermediate matrix having at least one binary decision element, wherein the second generating step and the applying step are performed for a predetermined number of iterations; and generating a final binary result at the computer system.

BRIEF DESCRIPTION OF THE DRAWINGS

These and other features and advantages of the present invention will become better understood with regard to the following description, appended claims, and the accompanying drawings, wherein:

DETAILED DESCRIPTION OF THE INVENTION

Figure 1:
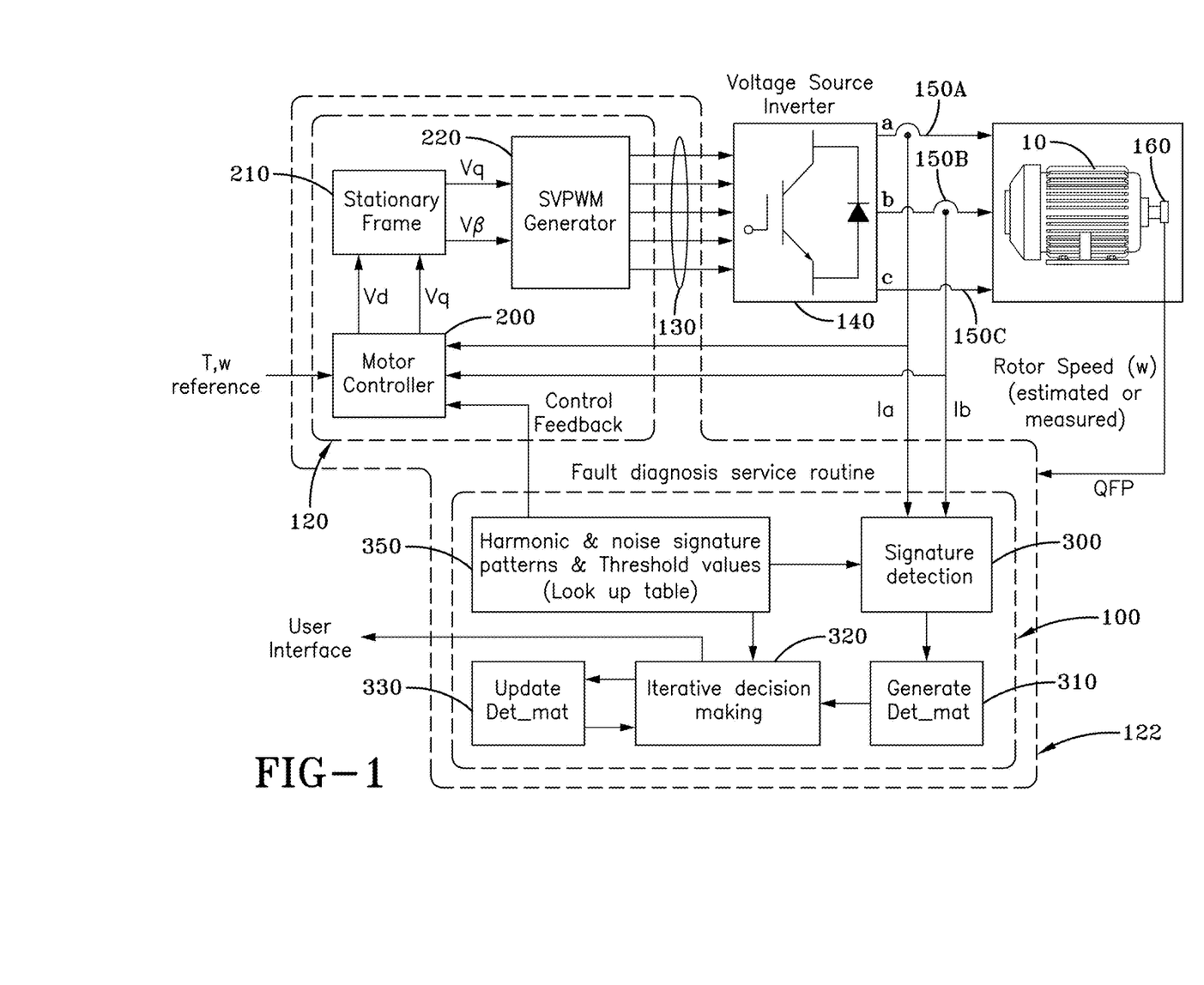
FIG. 1 is a schematic diagram of a condition monitoring system of the present invention utilized with an electric motor in accordance with the concepts of the present invention.

A system for iterative condition monitoring and fault diagnosis (i.e. condition monitoring system) of an electric machine 10, such as an electric motor or generator, is generally referred to by numeral 100, as shown in FIG. 1 of the drawings. It should be appreciated that the condition monitoring system 100 may be embedded in a digital signal processor (DSP) or any other suitable computing device. The condition monitoring system 100 to be discussed is configured to operate in conjunction with a motor control system 120 that is configured to generate and apply suitable motor control signals 130 to a voltage source inverter 140. The voltage source inverter 140 generates a three-phase power signal that is delivered via electrical lines 150A, 150B, and 150C to power the electric motor 10, so as to rotationally drive a shaft 160 provided thereby. It should be appreciated that the condition monitoring system 100 and motor control system 120 may be provided together or separately as functional components as part of a primary control module 122 that is embodied as hardware, software or a combination thereof, which may be provided as part of a single integrated processor, such as a DSP, or separately as discrete components, and which may be implemented in hardware, software or a combination thereof. It should be appreciated that the process or a portion thereof can be carried out with the principal control module 122 or may be performed by any suitable computing device.

In particular, the motor control system 120 includes a motor controller component 200, a stationary frame component 210, and a SVPWM (space vector pulse width modulation) generator 220, each of which may be configured in hardware, software or a combination thereof. Specifically, the motor controller component 200 generates voltage signals $V_d$ and $V_q$, which are delivered to the stationary frame component 210. The stationary frame component 210 processes the control voltage signals $V_d$ and $V_q$ to generate suitable frame voltage signals $V_\beta$ and $V_q$ that are delivered to the SVPWM generator 220. The SVPWM generator 220 generates the necessary motor control signals 130, which are received and converted by the voltage source invertor 140 to convert the D.C. (direct current) motor control signals 130 into 3-phase A.C. (alternating current) signals carried by electrical lines 150A-C to the electric motor 10, resulting in the energization of the motor 10 and rotation of the shaft 160 carried thereby.

Specifically, the condition monitoring system 100 includes a signature fault detection component 300 that is configured to receive the two 3-phase A.C. input signals from electrical lines 150A and 150B that supply electrical power from the voltage source inverter 140 to the electric motor 10. The output of the signature fault detection component 300 is coupled to a detection matrix generator component 310, which determines whether a binary decision "1" or a binary decision "0" should be used to populate a detection matrix (Det_mat) to be discussed in detail below. The output of the detection matrix generator component 310 is coupled to an iterative decision making component 320 that is configured to determine whether or not there is a fault condition at the motor 10 in a manner to be discussed in detail below. The output of the iterative decision making component 320 is also coupled to a secondary detection component or update detection matrix (Det_mat) component 330 and to a user interface, such as warning light or any other suitable visual/audible interface, or other data interface, e.g. keyboard/mouse and a display, provided by any suitable computing device. The update detection component 330 is configured to send updated detection matrix information, such as the results of the binary decision, back to the iterative decision making component 320. Thus, the update detection matrix component 330 is configured to operate in a bi-directional manner with the iterative decision making component 320, so as to allow the update detection matrix component 330 to update the detection matrix (Det_mat) in light of the decision made by the detection making matrix initially generated at the detection matrix generation component 310. Once the ultimate decision has been made, the iterative decision making component 320 sends information to the user interface, and the user interface will indicate to a user the condition of the machine fault.

Coupled to the signature detection component 300 and to the iterative decision making component 320 is a noise detection component 350, which helps to define the detection matrix (Det_mat) by analyzing the incoming input signals 150A-B and determining whether or not the signals 150A-B are background noise, or if the signals 150A-B meet a threshold value to potentially indicate a fault in the electric motor 10. Additionally, the noise detection component 350 may utilize a look up table that is stored in a suitable memory of the computer/processing hardware components used to implement the condition monitoring system 100 to identify both harmonic and noise signature patterns, as well as threshold values.

The condition monitoring system 100 of the present invention is configured to utilize a motor current signature analysis (MCSA) process to identify characteristic frequencies of a fault in a motor current spectrum as a frequency pattern, whereby the characteristic frequencies are grouped as a subset for subsequent evaluation utilizing a diagnostic process to be discussed in detail below. In particular, a motor current spectrum acquired by the condition monitoring system 100 from electrical lines 150A-B can be decomposed as follows:

$$M = F \cup H \cup R, \quad \text{(Eq. 1)}$$

where M is the motor current spectrum, F is the subset of fault characteristic frequencies, H is the subset of motor current harmonic signal frequencies, and R is the subset of random noise frequencies. Fault characteristic frequencies F have been identified through the use of MCSA analysis to identify associated electric motor fault conditions, including broken bar, eccentricity, bearing faults, winding short circuits, and end ring breakage.

For example, using MCSA analysis, a subset of fault frequencies in the motor current spectrum can be defined, such as in the case of eccentricity and broken bar, as follows:

$$F_1 = \{f_{eccentricity} | f_{eccentricity} = [1 \pm m(1-s)/(p/2)]f = f \pm mf_r\}, \quad \text{(Eq. 2); and}$$

$$F_2 = \{f_{broken\_bar} | f_{broken\_oar} = (1 \pm 2ks)f, k=1,2\}, \quad \text{(Eq. 3)}$$

where m is a positive integer, s is the per unit slip, f is a fundamental frequency of the stator current, $f_r$ is the mechanical rotation frequency, and p is the number of poles. Motor parameters, such as rotor frequency, per unit slip, etc., which are needed to identify the subset of fault frequencies F and to detect signatures are assumed by acquisition through the motor control service routine processed by the condition monitoring system 100. Thus, based on the identified subset, the method of the present invention can focus on the analysis of frequency patterns in the motor current spectrum.

By utilizing the fault frequencies distributed in a motor current spectrum, such as those in Eq. 2 and Eq. 3 for example, eccentricity and broken bar fault frequency patterns can be identified. By considering additional fault conditions and its associated frequency pattern in a motor current spectrum, subset F can be defined as follows:

$$F = F_1 \cup F_2 \cup \ldots F_j, \quad (Eq.\ 4)$$

where $F_j$ is the harmonic frequencies subset from a j-th fault condition.

The harmonic frequency elements in subset H can be identified by analyzing motor current spectrums that are generated by the motor 10 under different power qualities and motor health conditions. Under unbalanced winding conditions, uneven multiple harmonics are expected in a motor current spectrum. Due to additional unknown conditions, which may be the result of magnetic saturation, or other defects in the motor 10, the multiple fundamental harmonic frequencies are commonly modulated, which should be considered and avoided, for reliable diagnosis. Furthermore, subset H can be defined as follows:

$$H = \{f_{harmonic} | f_{harmonic} = mf\}, \quad (Eq.\ 5).$$

By utilizing subset F with eccentricity fault frequencies and subset H with fundamental harmonic frequencies, subset R with random noise frequencies in a motor current spectrum can be defined as follows:

$$R = M - F - H, \quad (Eq.\ 6).$$

Thus, all frequency elements, F, H, and R, may be identified in the motor current spectrum, and are dependent on specific electric machine parameters, such as per unit slip (s), the fundamental frequency (f), mechanical rotation frequency ($f_r$), and the number of poles (p), etc. The identified frequency pattern in a motor current spectrum, as shown in Eq. 1, can be utilized for electric motor diagnosis by utilizing its pattern information. Unlike conventional MCSA diagnosis, which is vulnerable to noise and interference by detecting only specific fault signatures in the motor current spectrum, the method of the present invention overcomes this obstacle of conventional MCSA analysis and is able to provide high-performance monitoring schemes, which are based on multiple fault frequencies, harmonics, and noise patterns in the motor current spectrum.

Continuing, by assuming that the subset of fault frequencies F, and the subset of noise frequencies R have been identified, an effective method of determining/identifying faults in a motor can be realized. The pattern of fault signatures in the motor current spectrum can be evaluated in many ways depending on the particular analysis approach utilized. It should be appreciated that the subset of fundamental harmonic currents, H, is commonly not of interest in fault diagnosis of a motor. Furthermore, detecting fault signatures where the electric machine operates in an environment that is subject to harsh electromagnetic noise conditions has been a challenge, as fault signatures are typically small to the noise in a harsh industrial environment. Thus, a noise immunized detection method 400 shown in FIG. 2, which is carried out by the condition monitoring system 100, is utilized to overcome this deficiency, and is configured to detect and/or distinguish small signal fault patterns from noise signal patterns.

Figure 2:
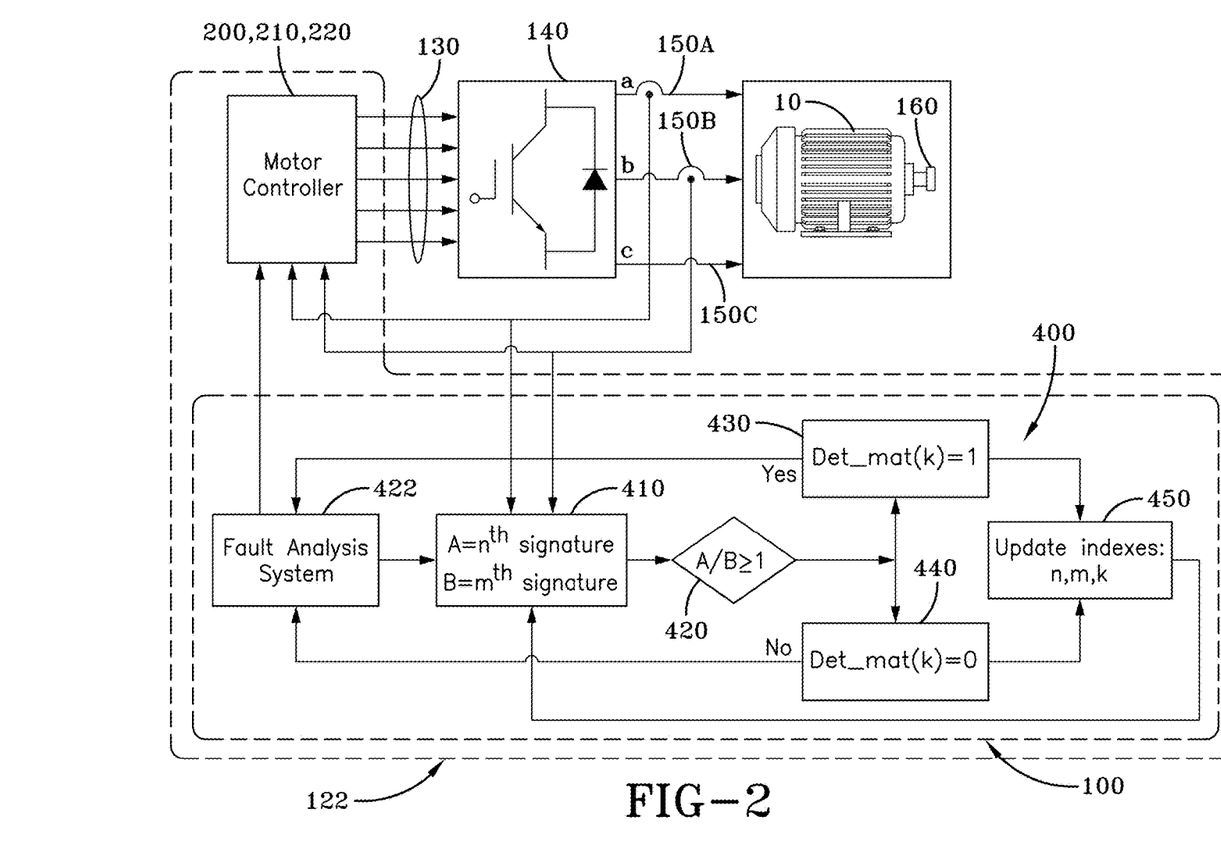
FIG. 2 is a schematic flow diagram showing the process employed by the condition monitoring system of the present invention in accordance with the concepts of the present invention.

In particular, the method by which the condition monitoring system 100 performs the fault analysis process 400 of the present invention is shown with reference to FIG. 2. Initially, at step 410, of the process 400, the energy, A-B of the respective n-th signature, which is limited to fault frequencies, is obtained for comparison to the m-th signatures, which are expected from the noise signatures in the motor current signals 150A-B, which are assumed from the subset R. Thus, two signatures are distinguished as n-th signatures (fault) and m-th signatures (noise) to evaluate fault signature energy over harsh motor current noise.

Based on the comparison of the amplitudes between A and B of the respective n-th (fault) and m-th (noise) signatures at step 420, a decision is made as to whether a binary 1 or 0 should be assigned to a detection matrix (Det_mat). It should be appreciated that the comparison may be implemented to determine whether the energy A (fault) is greater than energy B (noise). A detection matrix (Det_mat) stored at a fault analysis component 422 is defined and updated with the binary decision results "1" at step 430, or the binary decision result "0" at step 440, whose element index is defined with integer k. Multiple comparisons are carried out by updating indexes n, m, and k, as shown at step 450, in FIG. 2. Fault analysis can then be performed by analyzing the generated detection matrix (Det_mat).

In one example of the process of steps 410, 420, 430, 440, two signals are assumed, which are taken from the noise frequency subset R. Based on the comparison of amplitude A and B of those two signals, binary decisions, "1" or "0" are made to generate a detection matrix (Det_mat). The result is random, whereby the probability of 1s will be 0.5. Multiple comparison trials will produce a Det_mat as follows:

$$Det\_mat = [1\ 1\ 0\ 0\ 1\ 0\ \ldots] \quad (Eq.\ 7).$$

In a second example of the process, two signals are assumed, such that one is from the noise frequency subset R and the other is from the fault frequency subset F. Based on the comparison of the energies A and B of those two signals, binary decisions such as "1" or "0" are made to generate the detection matrix (Det_mat) as follows:

$$Det\_mat = [1\ 1\ 0\ 1\ 1\ 1\ \ldots] \quad (Eq.\ 8).$$

In particular, more 1's are expected in the Det_mat identified in Eq. 8 than in the Det_mat identified in Eq. 7 because the fault signal from the subset F will have larger energy over noise with higher probability. The probability of 1s in Eq. 8 depends on the SNR, which is the fault signature-to-noise ratio.

Figure 3:
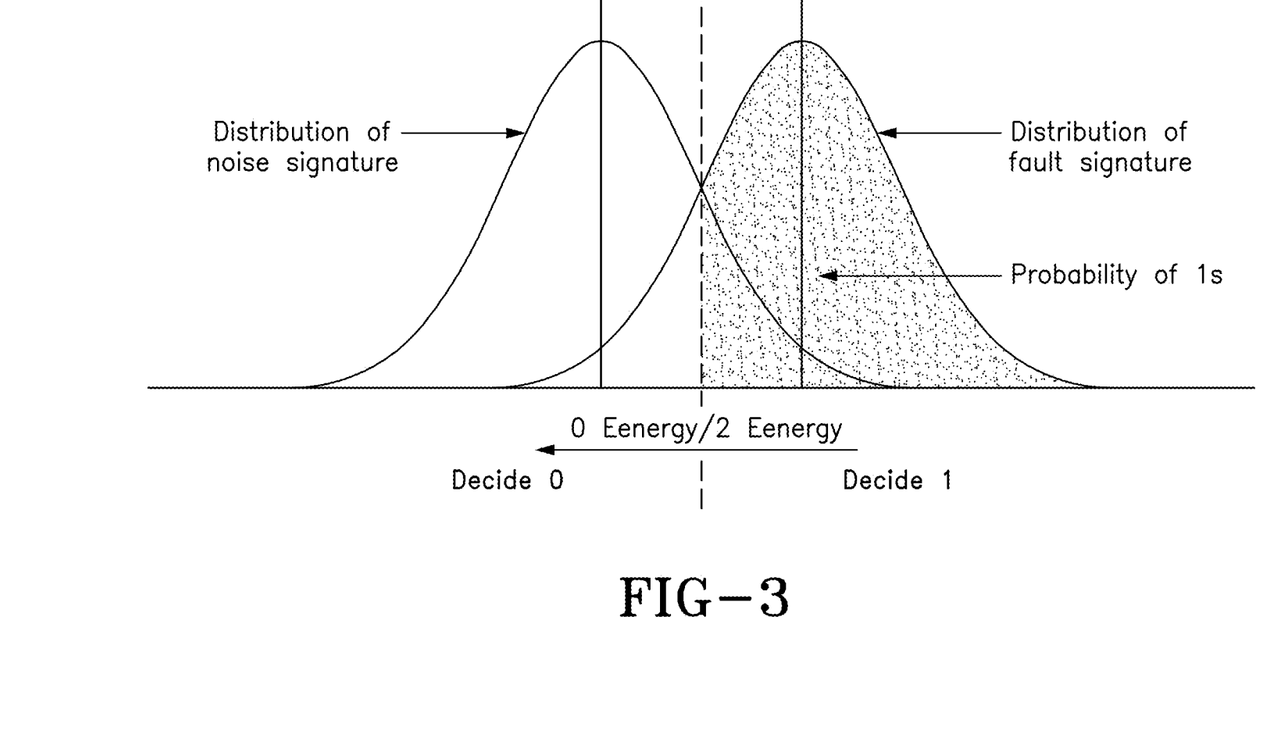
FIG. 3 is a probability distribution graph of 1s and 0s in the Det_mat of the present invention which assumes a zero mean Gaussian noise channel where $E_{energy}$ is the energy of a fault signal.

Probability distributions of 1s or 0's in the Det_mat by assuming a zero mean Gaussian noise channel are depicted in FIG. 3, where $E_{energy}$ is the energy of the fault signal. The total area of each graph is a probability 1.0. The threshold for the superiority decision of 0 or 1 is equivalent to $\gamma = E_{energy}/2$. The threshold assumption will be used in the analysis of the detection probability.

Detection probability has been effectively modeled through a Q-function using know techniques. By assuming a threshold, $\gamma$, the probability of detection and its associated detection errors may be calculated. Specifically, the Q-function may be used to calculate detection errors, such as Type I errors, which indicate a miss detection, and Type II errors, which indicate a false detection. The overlap area between the distribution of noise signature and distribution of fault signatures in FIG. 3 is the probability of those Type I and Type II errors. As such, the detection method of the present invention is able to minimize both Type 1 and Type 2 errors, which is desirable.

In FIG. 3, the shaded area, which is larger than the threshold $\gamma=E_{energy}/2$ represents the detection probability of 1s in the Det_mat that can be calculated using the Q-function as follows:

$$p=Q((\gamma-E_{energy})/\sqrt{\sigma^2 E_{energy}}), \quad \text{(Eq. 9);}$$

where $E_{energy}$=Expectation $(\Sigma[(s(k)+w_k)s(k)])$, k=1, 2, .... As such, $E_{energy}$ is the energy of the fault signature, Q is the Q-function and, s(k) is the fault signal, $w_k$ is the motor noise, $\sigma^2$ is the noise variance, and $\gamma$ is assumed as the arbitrary threshold definition. As the shaded area gets larger, the probability that the motor be considered faulty is increased, which is calculated as "p" in Eq. 9. The probability (p) of 1s in the Det_mat, or detection matrix, can be determined by assuming $\gamma=E_{energy}/2$ as follows:

$$p=Q((\gamma-E_{energy})/\sqrt{\sigma^2 E_{energy}})=Q(\sqrt{E_{energy}}/\sigma^2/2), \quad \text{(Eq. 10).}$$

For example, with a healthy motor where fault signal energy is supposed to be zero ($E_{energy}=0$), the probability of 1s is as follows:

$$\begin{aligned}
p &= Q\left((\gamma-E_{energy})/\sqrt{\sigma^2 \, E_{energy}}\right) \\
&= Q\left(((E_{energy}/2) - E_{energy})/\sqrt{\sigma^2 \, E_{energy}}\right) \\
&= Q\left(-(E_{energy}/2)/\sqrt{\sigma^2 \, E_{energy}}\right) = Q\left(-\sqrt{E_{energy}}/\sigma^2/2\right) \\
&= Q(0) = 0.5,.
\end{aligned} \quad \text{(Eq. 11)}$$

Thus, the probability of 0.5 is representative of the comparison of a noise signal and a fault signal in a healthy motor, which is fully random.

The binary numbers in the detection matrix (Det_mat) may be analyzed through binomial distribution. The binomial results in the detection matrix (Det_mat) are effectively the same statistical event as tossing a coin with a probability bias p, such as 1 or 0, which is expected to have the indication of a faulty or healthy motor. A decision metric T is defined to effectively analyze the fault dependent information of the detection matrix (Det_mat) by normalizing its elements as follows:

$$T = \frac{1}{N_1}\sum_{l=1}^{N_1} \text{Det\_mat}(l),; \quad \text{(Eq. 12)}$$

wherein the binomial distribution of the detection matrix (Det_mat) of T in Eq. 12 is derived as follows:

$$\begin{aligned}
P_{binomial}(TN_1) &= \binom{N_1}{TN_1} p^{TN_1}(1-p)(1-T)N_1 \\
&= ((N_1)!/(TN_1!((1-T)N_1)!)p^{TN_1}(1-\\
&\quad p)(1-T)N_1,
\end{aligned} \quad \text{(Eq. 13)}$$

Figure 4:
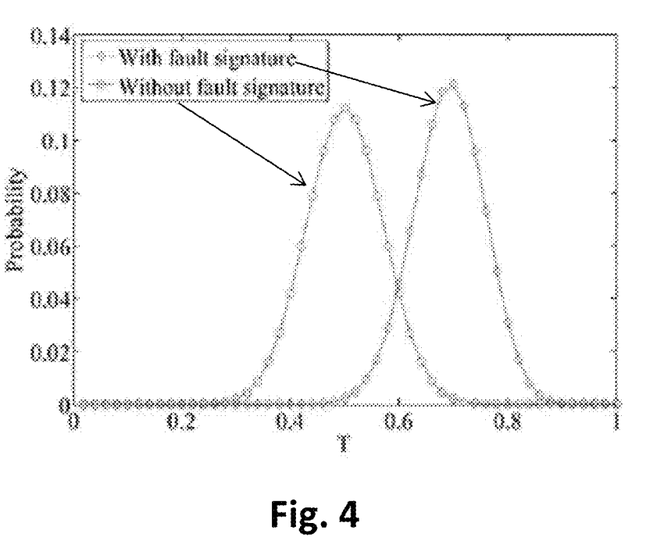
FIG. 4 is a graph showing the probability distribution of a decision metric T based on a binomial distribution of T.

Based on Eq. 13, the statistical distribution of Det_mat is derived through the binomial distribution. FIG. 4 shows the probability distribution of the decision metric T based on the binomial distribution in Eq. 13. Expectedly, the distribution shows a peak at 0.5 when there is no fault signature (i.e. healthy motor). In addition, the peak shown in FIG. 4 is moved toward probability 1 as the fault signals develop energy in a faulty motor.

Figure 5:
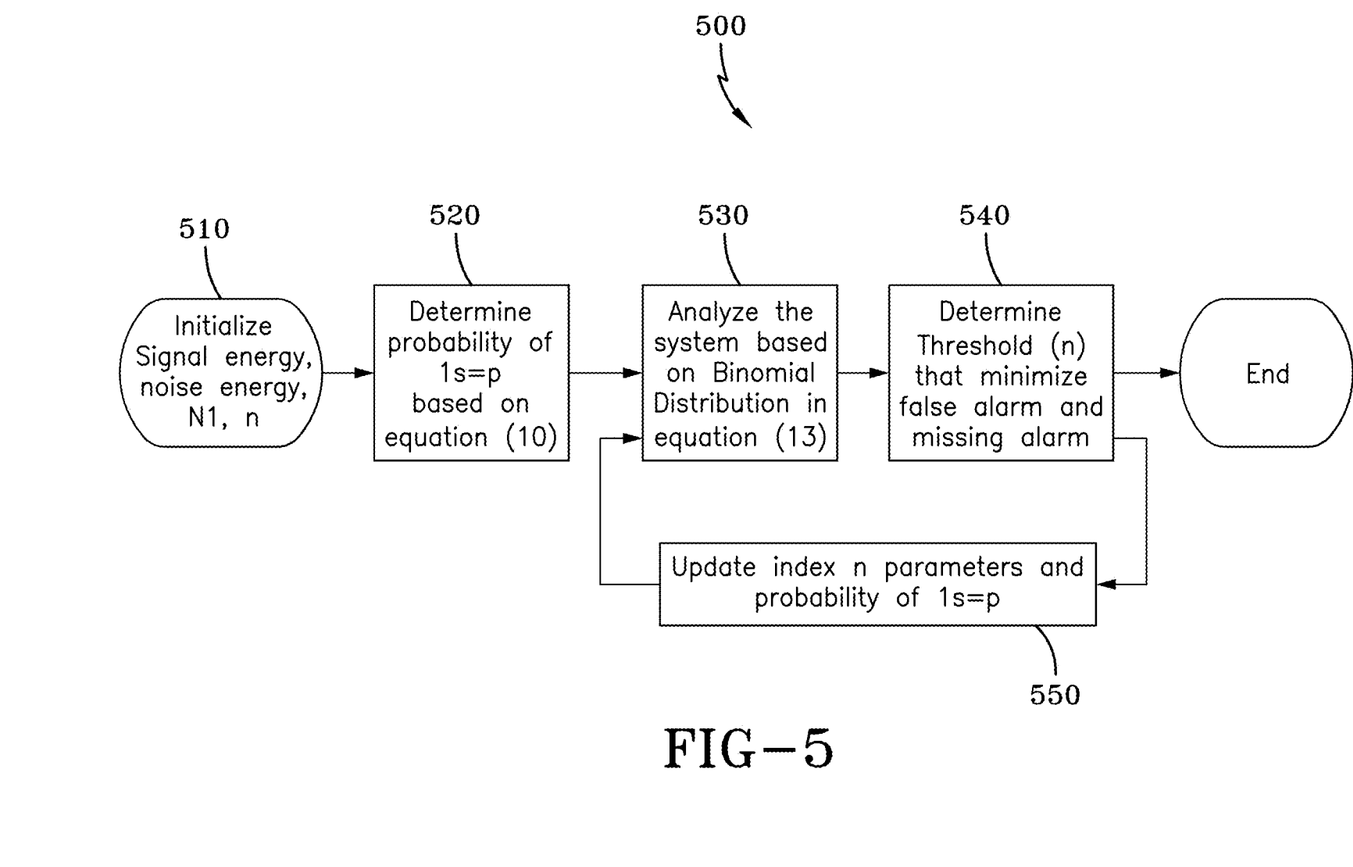
FIG. 5 is a flow diagram showing multiple thresholds which are statistically and iteratively designed based on the probability analysis and the binomial distribution of a detection matrix (Det_mat) in accordance with the concepts of the present invention.
Figure 6:
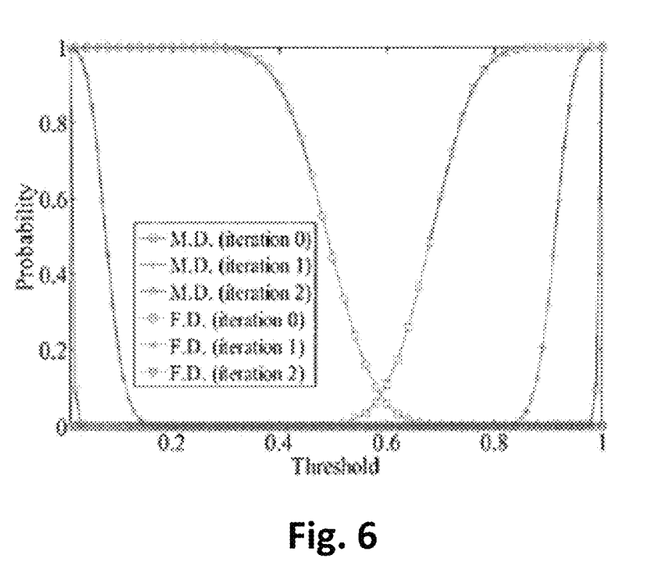
FIG. 6 is a graph showing the probability distribution of miss detection (M.D.) and false detection (F.D.) in accordance with the concepts of the present invention.

Based on the probability analysis and the binomial distribution of the detection matrix (Det_mat), thresholds can be designed to evaluate the health condition of a motor. Multiple thresholds, Threshold (n), are statistically and iteratively executed via the harmonic and noise signal patterns and threshold values of the component 350, as well as the other components, of the condition monitoring system 100 as necessary by executing a process 500 shown in FIG. 5. Specifically, at step 510, the iterative threshold process 500 is executed to initialize signal energy, noise energy NI, and n. Next, at step 520, the probability of 1s=p is determined based on Eq. (10). Continuing, to step 530, the system is analyzed based on the binomial distribution of Eq. (13). At step 540, the process 500 determines the threshold (N) that minimizes false alarms and missing alarms. In addition, the process 500 continues to step 550, where the index n and probability of 1s=p are updated, before the process 500 returns to step 530. As such, steps 530, 540 and 550 are iteratively performed. For example, by assuming that the SNR is equal to −65 dB, a probability of 1s=p can be derived based on the binomial distribution of Eq. 13, which is shown in FIG. 4. Threshold (1) can be derived at the point that simultaneously minimizes false alarms and miss alarms, which is T=0.6, as shown in FIG. 6. The nth threshold [Threshold (n)] can be iteratively designed following the process 500 to update the probability (p) based on the decision through Threshold=0.6, as shown in FIG. 5.

Figure 7:
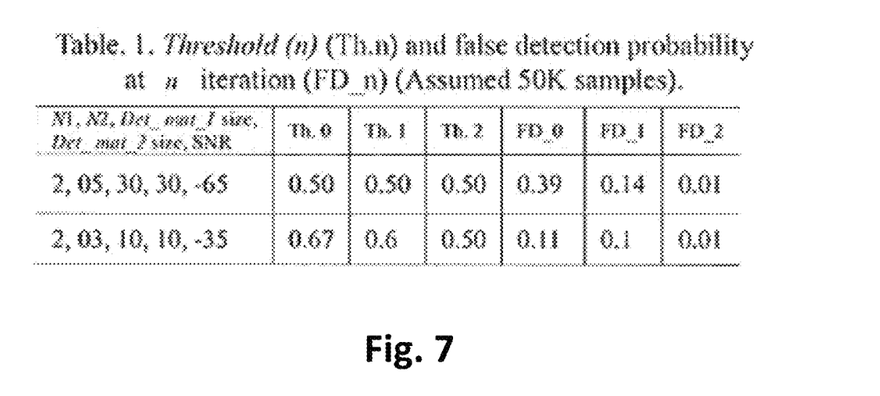
FIG. 7 shows Table 1, which provides examples of a threshold design and false detection analysis of two different model systems in accordance with the concepts of the present invention.

FIG. 7 shows a table of examples of threshold design and false detection analysis in two different exemplary systems. In each system, three thresholds are designed. In the system, N1, N2, Det_mat_1 size, Det_mat_2 size, SNR are respectively assumed to be 2, 0.3, 10, 10, −35, while the designed thresholds are as follows: Threshold (0)=0.67, Threshold (1)=0.6, and Threshold (2)=0.5. By iteratively applying three thresholds, the false detection probability is shown to decrease from FD_0=0.11 to FD_3=0. As such, the false detection error converges to a 0 error statistic as the iterative decision making increases.

Figure 8:
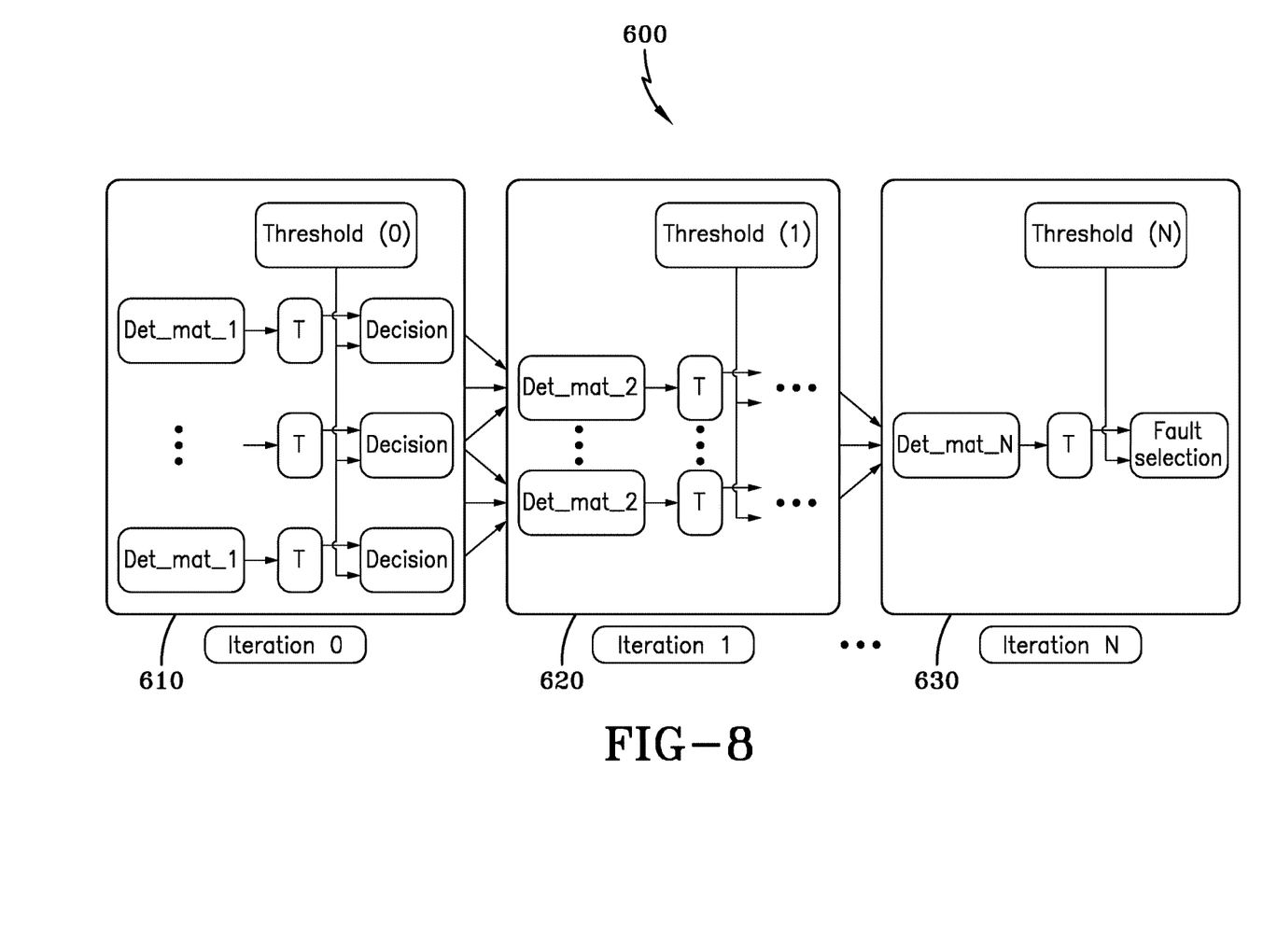
FIG. 8 is a flow diagram showing an iterative decision-making scheme carried out in accordance with the present invention.

The manner in which the decision making component 320 analyzes the performance of the electric motor 10 through a designed iterative decision making process 600 is shown in FIG. 8. It should be appreciated that process 600 allows error probabilities (false alarm and miss alarm) to separate as more iterative decision-making is performed. For example, with an iteration of 2, errors are mostly avoided, which results in almost zero error with a simple threshold of 0.5. This proves the effectiveness of the iterative decision making process of the decision making component 320 under harsh noise conditions when determining the health status of the motor 10. Specifically, the overall implementation of the iterative decision making process 600 of the decision making component 320 is shown in FIG. 8. Initially, at step 610 a threshold of 0 is applied to the decision metric T of the detection matrix 1 (Det_mat_1) at the 0 iteration, which generates a binary decision of "1" or "0" which is used to form the detection matrix 2 (Det_mat_2) at step 620. In addition addition, at step 620 a threshold of 1 is applied to the decision metric T of the detection matrix 2 (Det_mat_2) in the 1 iteration, which generates a binary decision of "1" or "0", which is used to form the detection matrix N (Det_mat_N) of step 630. Finally, iterative decision making continues to obtain a final binary result of "1" or "0" by applying a threshold of N for the metric T of the detection matrix N (Det_mat_N) in N iteration, as indicated at step 630. The theoretically designed thresholds for the thresholds shown in FIG. 8 are 0.67, 0.6, and 0.5 for Threshold (0), Threshold (1), and Threshold (2), respectively. An SNR (signal-to-noise ratio) of −35 dB is assumed in the threshold design, which approximates the harsh noise conditions that are experienced by a motor current signal analysis and motor health monitoring system.

Figure 9:
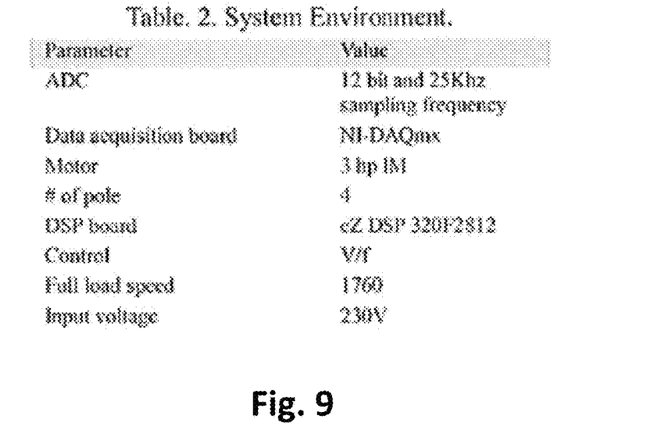
FIG. 9 shows Table 2, which provides the various operating parameters of a testing system environment used to evaluate the present invention.

I. Experimental Results:

Experimental verification was performed to demonstrate the effectiveness of the system and method of the present invention using the testing system environment having the specific specification and characteristics shown in FIG. 9. The verification tests of the system and method 122, 400 of the present invention were executed utilizing a DSP (TI ez DSP 320F2812) and line current data obtained by a 1.25 MS/s 12-bit resolution data acquisition system. V/f control was utilized to evaluate the method 400 implemented by the present invention; however, similar approaches can be applied to advanced controls such as field oriented controls (FOC) or direct torque controls (DTC).

Figure 10A:
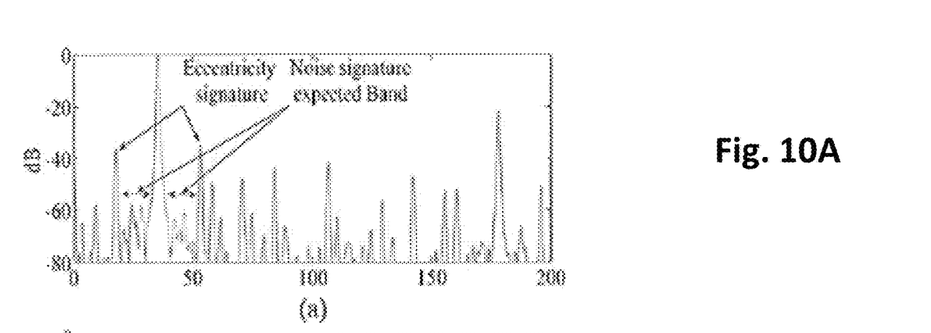
FIG. 10A is a current FFT spectrum graph showing a fault signal frequency and noise frequencies in a steady state condition with a eccentricity fault excitation frequency of 33.5 Hz under 0% torque (V/f motor controlled)
Figure 10B:
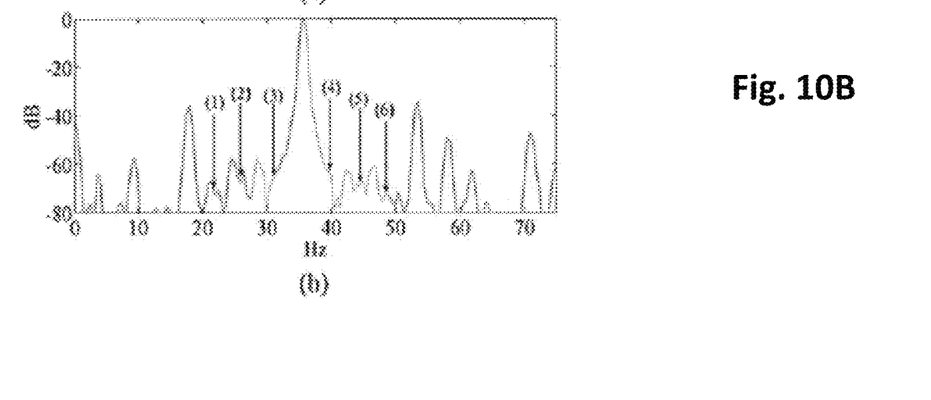
FIG. 10B is a current FFT spectrum graph showing six selected noise frequency signatures in a steady state condition with a eccentricity fault excitation frequency of about 33.5 Hz under 0% torque (V/f motor controlled)
Figure 11A:
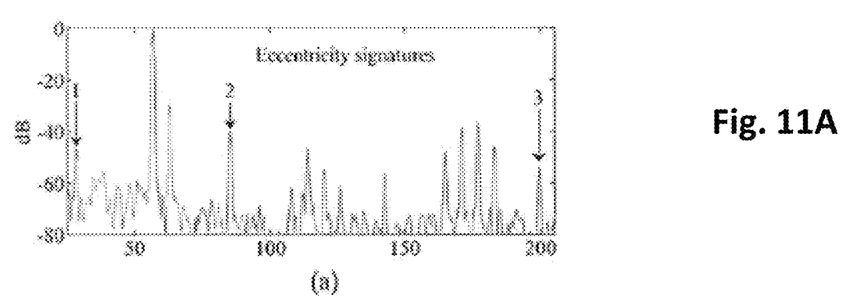
FIG. 11A is a current FFT spectrum graph showing an eccentricity signature is at an excitation frequency of about 57 Hz and at a torque of about 10%.
Figure 11B:
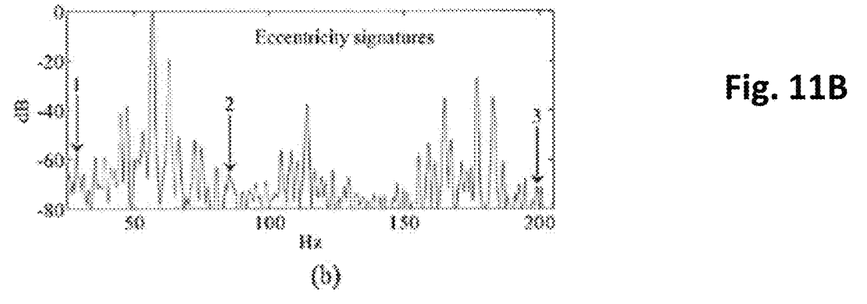
FIG. 11B is a current FFT spectrum graph showing an eccentricity signature at an excitation frequency of about 57 Hz and at a torque of about 50%.

FIGS. 10A, 10B, 11A, and 11B show the offline data obtained by utilizing a 1.25 MS/s and a 12-bit resolution data acquisition card. FIG. 10A shows the fault signal frequencies and noise frequencies that were observed at a steady state condition through fast Fourier transformation (FTT) analysis. The resolution of the FTT is 0.02 Hz in all Figs. FIG. 10B shows six selected noise frequency signatures which are at the frequencies expecting no fundamental harmonics current and any other fault frequencies based on MCSA analysis. FIGS. 11A and 11B show an eccentricity fault signature, which tends to decrease as load torque increases on the motor 10. It is shown that the eccentricity signature gets close to the noise level under a 50% torque condition.

The performance of the method of the present invention is evaluated based on dominant eccentricity signatures under light load conditions and noise-like signatures up to 50% load conditions. In the detection of noise and fault signatures, approximately 50,000 samples were used by utilizing cross-correlation based signal acquisition schemes.

A. Frequency Pattern:

The frequency-pattern is investigated only around the fundamental frequency of the motor current signal to prove the concept of the method of the present invention. The side bands of broken rotor bar and eccentricity fault signatures are considered as follows:

$$f_{eccentricity}=[1\pm m((1-s)/(p/2))]f=f\pm mf_r, m=1,2, \quad \text{(Eq. 14)}$$

$$f_{broken\_bar}=(1\pm 2ks)f, k=1,2, \quad \text{(Eq. 15)}$$

$$f_{fundamental}=f, \quad \text{(Eq. 16)}$$

In addition, the method of the present invention is designed to determine reliable noise signatures, which do not overlap with fault signatures or any other harmonic signatures under all operating conditions of an electric machine. To further enhance the reliability of the method of the present invention, noise signature frequencies are effectively defined though the frequency equation, which depends on the operating point of the electric machine. Noise signature frequencies are simply defined by considering eccentricity harmonics, broken bar harmonics, and fundamental harmonics as follows:

$$f_{noise\_1}=f-n(f-f_r)/4, \quad \text{(Eq. 17)}$$

$$f_{noise\_2}=f+n(f-f_r)/4, \quad \text{(Eq. 18)};$$

where n=1,2,3. Noise frequencies and fault frequencies are dependent upon the motor speed variable, which is continuously available in any operating point. The detection of each frequency signal has been performed through the use of low complexity and high noise immunized detection methods of the present invention by a matched filter. Equations 14-18 are defined only around the fundamental frequency of the motor 10 for efficient testing of the method within a limited frequency range. A noise pattern was successfully defined for use as reference for small fault signature detection in a motor current spectrum. Eccentricity signatures were evaluated with reference to the derived noise signature pattern.

Figure 12:
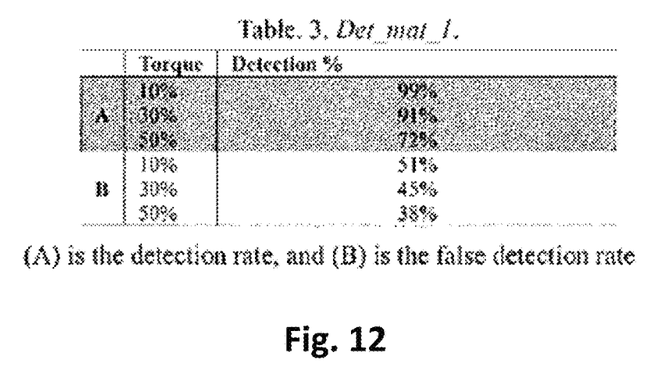
FIG. 12 shows Table 3, which provides an averaged detection rate (detection rate and false detection) of the detection matrix, Det_mat_1, at the 0 iteration of the process shown in FIG. 8.

FIG. 12 shows the averaged detection rate (detection rate and false detection) of the detection matrix, Det_mat_1, at the 0 iteration, as shown in FIG. 8. The results were obtained through 100 experimental trials. FIG. 12 also shows that the detection rate is high at low torque, as the amplitudes of the eccentricity signatures tend to be elevated at low load operation of the motor 10. As the load increases, the detection rate begins to decrease due to the damped eccentricity signature amplitudes caused by motor inertia. The detection rate may be as low as 72% at 50% torque, while the detection rate may be as high as 99% at 10% torque. At a 50% torque load, as shown in FIG. 11B, the eccentricity signature is almost close to the noise signature, and is difficult to be discriminated from the noise signature in the motor current signal. Thus, the detection rate is not satisfactory over the entire torque operating condition showing non-negligible errors, which may not be utilized for a reliable diagnosis purpose. The false detection rate in rows B of FIG. 12 is measured in a healthy motor. As shown in FIG. 12, the false detection rate is very high under the tested operating conditions of the motor 10. As such the false detection rate is not acceptable for reliable diagnosis systems over various operating conditions.

Figure 13:
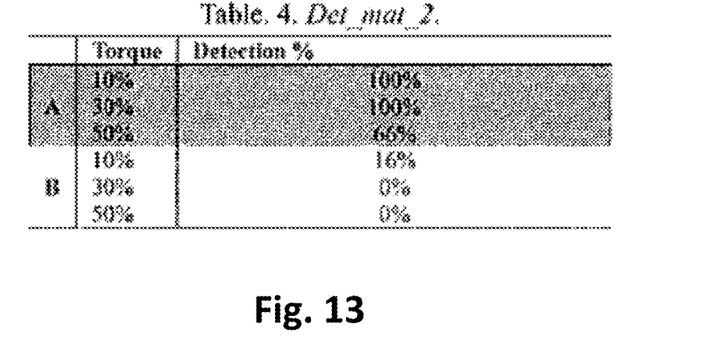
FIG. 13 shows Table 4, which provides the averaged detection rate (detection rate and false detection) of the detection matrix, Det_mat_2, which was obtained by applying a pre-designed Threshold (0) of 0.67 to the Det_mat_1 in the first decision iteration of the process shown in FIG. 8.

B. Steady-State Results:

FIG. 13 shows the detection matrix (Det_mat_2), which is obtained by applying the pre-designed Threshold (0) of 0.67 to the Det_mat_1 in the first decision iteration as shown in FIG. 8. The result shows that the detection performance is significantly improved, such that the detection rate gets close to 100%, while the false detection rate is suppressed to 0%. However, the detection performance under 50% torque and the false detection under 10% torque are still not satisfactory.

Figure 14:
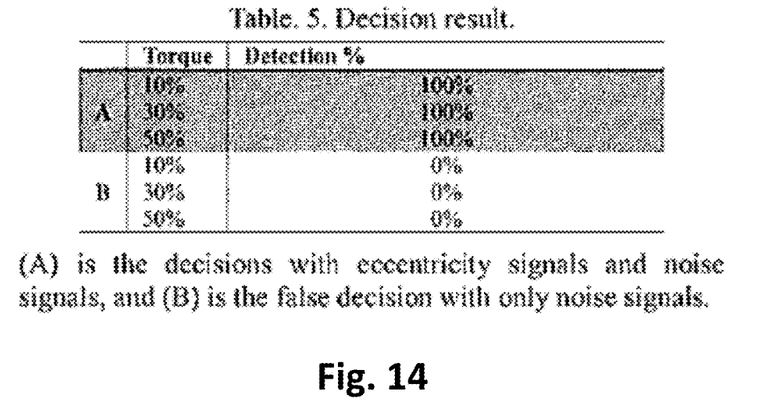
FIG. 14 shows Table 5, which provides the decision results of FIG. 12 obtained by applying Threshold (1) of 0.6 to the Det_mat_2 in the second iteration in FIG. 8.

FIG. 14 shows the results obtained by applying Threshold (1) of 0.6 to the Det_mat_2 in the second decision iteration as shown in FIG. 8. The residual errors shown in FIG. 13 are further reduced and the decision is made correctly with zero false detection. The signature with −65.1 dB at 50% torque in FIG. 11b is detected correctly and it is clearly shown that the iterative decision-making method progressively improves the fault detection performance of the process.

Figure 15:
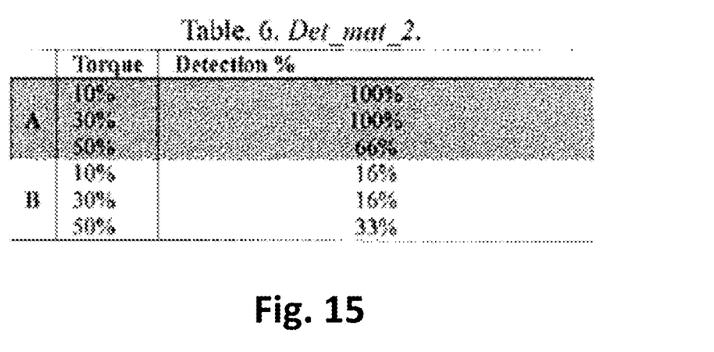
FIG. 15 shows Table 6, which provides the averaged detection rate (detection rate and false detection) of the detection matrix, Det_mat_2, under transient motor conditions with a linear speed change from about 934 RPMs to about 1370 RPMs within approximately 10 seconds.

Similar testing is performed during the transient condition of the motor 10, during the linear speed change from about 934 RPMs to about 1370 RPMs within an approximated 10 second time period. FIG. 15 shows Det_mat_2, and as compared with FIG. 13, that was obtained in the steady state condition, a slightly increased error was observed in the false alarm, shown in rows B of the table. The tolerable variations even in transient conditions are due to the nature of the Det_mat.

Figure 16:
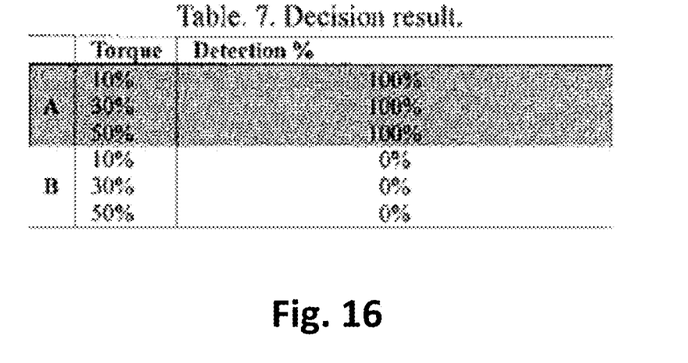
FIG. 16 shows Table 7, which provides the decision results of FIG. 14 obtained by applying Threshold (1) of 0.6 to the Det_mat_2 in the first iteration of the process shown in FIG. 8.

Since the elements in the detection matrix (Det_mat) are obtained by comparing the energy of signals, the comparison results tend to be maintained as in the steady state condition, if those signals are affected similarly by the non-stationary transient operation of a motor in a short time. Those slightly increased false detection errors are again suppressed by applying the designed threshold to the results as shown in FIG. 16. Moreover, FIG. 16 shows that the method of the present invention achieves the correct decision even in the transient case while simultaneously avoiding false detection errors.

Figure 17:
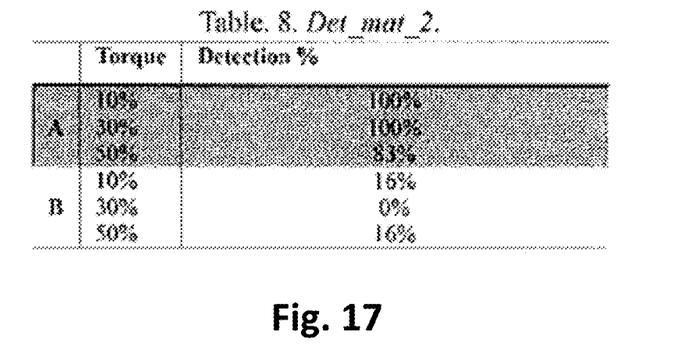
FIG. 17 shows Table 8, which provides the averaged detection rate (detection rate and false detection) of the detection matrix, Det_mat_2, under the transient motor conditions with a sinusoidal speed change from about 934 RPMs to about 1370 RPMs within approximately 10 seconds.
Figure 18:
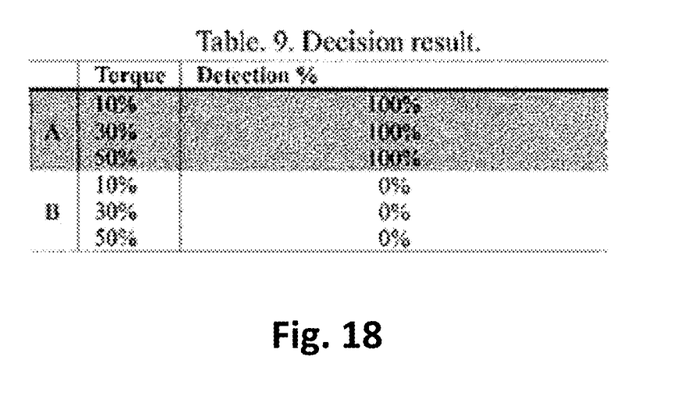
FIG. 18 shows Table 9, which provides the decision results of FIG. 16 that are obtained by applying Threshold (1) of 0.6 to the Det_mat_2 in the first iteration of the process shown in FIG. 8.

C. Transient Results:

Similar testing is performed under transient motor conditions with a sinusoidal speed reference of about 934 RPMs (revolution per minute) to about 1370 RPMs within an approximated 10 second time period. FIG. 17 shows the detection matrix 2 (Det_mat_2). A similar result is shown in FIG. 15, which implies that the method of the present invention can be successfully executed under two different types of transient patterns. FIG. 18 shows a corrected result of FIG. 17.

Therefore, one advantage of the present invention is that a system and method for fault diagnosis of an electric machine, such as an electric motor or generator, is able to diagnose faults in harsh noisy industrial environments. Another advantage of the present invention is that the system and method for fault diagnosis of an electric machine is able to achieve close to 100% accuracy, while suppressing fault detection rates to nearly 0%, even when the electric machine is subject to non-linear speed variations. Still another advantage of the present invention is that the system and method for fault diagnosis of an electric machine achieves high-performance motor health diagnosis operation by simultaneously utilizing multiple fault signature patterns, noise signal frequency patterns, and fundamental harmonics current frequency patterns of a whole electric motor current signal. Yet another advantage of the present invention is that the system and method for fault diagnosis of an electric machine is robust, and immune to signal distortion and inherent motor noise that is generated during dynamic motor operation. Another advantage of the present invention is that the system and method for fault diagnosis of an electric machine provides a robust small signal detection method that utilizes defined noise signatures, whereby the method is operable independent of the type of electric machine/motor, or the type of motor control system used. Still further, another advantage of the present invention is that the system and method for fault diagnosis of an electric machine may be applied to other types of electric machines based on identified noise signatures and harmonics patterns in a motor current spectrum. A further advantage of the present invention is that the system and method for fault diagnosis may be utilized to monitor distributed or mobilized power electronics systems, such as hybrid electric vehicles (HEV), electric vehicles (EV), remote wind turbines, or any other desired electric machine, where the operating conditions are harsh and noisy and continuously varying, such as in modern energy conversion systems.

Thus, it can be seen that the objects of the present invention have been satisfied by the structure and tis method for use presented above. While in accordance with the Patent Statutes, only the best mode and preferred embodiment has been presented and described in detail, it is to be understood that the present invention is not limited thereto or thereby. Accordingly, for an appreciation of the true scope and breadth of the invention, reference should be made to the following claims.

What is claimed is:

1. A method of detecting a fault comprising the steps of:
providing a 3-phase AC (alternating current) motor coupled to a voltage source inverter;
coupling a control feedback module to said voltage source inverter including:
a motor controller;
a stationary frame module to convert voltage output signals of said motor controller into frame voltage signals; and
a SVPWM (space vector pulse width modulation) generator to receive said frame voltage output signals, said SVPWM generator configured to generate a 3-phase signal for supplying to said 3-phase AC motor, and wherein said motor controller monitors 2 phases of said 3-phase signal;
detecting said 2 phases of said 3 phase signal to identify a motor current spectrum signature;
identifying n fault characteristic frequency signatures from said motor current spectrum signature, wherein n is a positive integer value;
identifying m random noise frequency signatures from said motor current spectrum signature, wherein m is a positive integer value equal to n;
comparing an amplitude of said n fault characteristic frequency signatures with an amplitude of said m random noise frequency signatures;
generating at least one initial detection matrix including at least one matrix element, such that each said matrix element is associated with said comparison of an amplitude of said n fault characteristic frequency signatures and an amplitude of said m random noise frequency signatures;
assigning a first binary number to said matrix element if said amplitude of said n fault characteristic frequency signatures is greater than said amplitude of said m random noise frequency signatures to identify the presence of a fault, or assigning a second binary number different from said first binary number to said matrix element if said amplitude of said fault characteristic frequency signatures is less than said amplitude of said random noise frequency signatures to identify the presence of a non-fault;
generating a probability distribution based on said at least one initial detection matrix;
applying a predetermined threshold value to said probability distribution of said at least one initial detection matrix to generate a binary decision element;
generating an intermediate detection matrix that includes said binary decision element, wherein said second generating step and said applying step are performed for said intermediate decision matrix to generate a final binary decision value, and wherein said threshold value applied to said intermediate decision matrix is different from said threshold value applied to said at least one initial detection matrix; and
determining whether a fault is present in the 3-phase AC motor based on said final binary decision value.

2. The method of claim 1, wherein said probability distribution is generated by binomial distribution.

3. A system to detect a fault comprising:
a 3-phase AC (alternating current) motor including a voltage source inverter coupled thereto;
a control feedback module to said voltage source inverter including:

a motor controller;

a stationary frame module to convert voltage output signals of said motor controller into frame voltage signals; and a SVPWM (space vector pulse width modulation) generator to receive said frame voltage output signals, said SVPWM generator configured to generate a 3-phase signal for delivery to said 3-phase AC motor;

a signature detection means for detecting signatures based on at least 2 of said 3 phases applied to the 3-phase AC motor;

a detection matrix generator means for generating a detection matrix of binary elements based on a signal output by said signature detection means;

a decision making means for determining whether there is a fault condition associated with the electric motor;

an update detection matrix means for updating said detection matrix, said update detection matrix means in bi-directional communication with said decision making means; and a noise detection means for determining whether said signature includes noise.

* * * * *